United States Patent
Liao

(10) Patent No.: US 11,367,762 B2
(45) Date of Patent: Jun. 21, 2022

(54) PIXEL DEFINITION LAYER, DISPLAY SUBSTRATE, DISPLAY DEVICE AND INKJET PRINTING METHOD

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventor: Chin Lung Liao, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 618 days.

(21) Appl. No.: 16/337,591

(22) PCT Filed: Aug. 31, 2018

(86) PCT No.: PCT/CN2018/103584
§ 371 (c)(1),
(2) Date: Mar. 28, 2019

(87) PCT Pub. No.: WO2019/105084
PCT Pub. Date: Jun. 6, 2019

(65) Prior Publication Data
US 2021/0376017 A1 Dec. 2, 2021

(30) Foreign Application Priority Data
Nov. 30, 2017 (CN) .......................... 201711242252.5

(51) Int. Cl.
*H01L 27/32* (2006.01)
*H01L 51/00* (2006.01)

(52) U.S. Cl.
CPC ...... *H01L 27/3246* (2013.01); *H01L 27/3216* (2013.01); *H01L 27/3218* (2013.01); *H01L 51/0005* (2013.01)

(58) Field of Classification Search
CPC ...................... H01L 27/3216; H01L 27/3246
See application file for complete search history.

(56) References Cited

U.S. PATENT DOCUMENTS

| 10,297,650 B2 | 5/2019 | Park et al. | |
|---|---|---|---|
| 2005/0266763 A1* | 12/2005 | Kimura | H01L 51/0005 445/24 |

(Continued)

FOREIGN PATENT DOCUMENTS

| CN | 104465671 A | 0/3201 |
|---|---|---|
| CN | 1434666 A | 8/2003 |

(Continued)

OTHER PUBLICATIONS

The Extended European Search Report dated Aug. 3, 2021; Appln. No. 18857420.6.

(Continued)

*Primary Examiner* — Daniel P Shook

(57) ABSTRACT

A pixel definition layer, a display substrate, a display device and an inkjet printing method are provided. The pixel definition layer includes a first pixel definition layer and a second pixel definition layer. The first pixel definition layer includes first openings, which include a first sub-pixel opening and a second sub-pixel opening; and an opening size of the second sub-pixel opening is larger than an opening size of the first sub-pixel opening. The second pixel definition layer is on the first pixel definition layer, and includes second openings, the second openings include a fourth sub-pixel opening and a fifth sub-pixel respectively corresponding to and connecting to the first sub-pixel opening and the second sub-pixel opening. A difference between (Continued)

opening sizes of the fourth sub-pixel opening and the first sub-pixel opening is larger than a difference between opening sizes of the fifth sub-pixel opening and the second sub-pixel opening.

20 Claims, 4 Drawing Sheets

(56) References Cited

U.S. PATENT DOCUMENTS

| | | | |
|---|---|---|---|
| 2016/0079323 A1 | 3/2016 | Choi et al. | |
| 2017/0069697 A1* | 3/2017 | Hashimoto | ......... H01L 27/3246 |
| 2017/0194395 A1 | 7/2017 | Hu et al. | |

FOREIGN PATENT DOCUMENTS

| | | | |
|---|---|---|---|
| CN | 105097882 A | 11/2015 | |
| CN | 105404038 A | 3/2016 | |
| CN | 105448953 A | 3/2016 | |
| CN | 106328675 A | 1/2017 | |
| CN | 107331647 A | 11/2017 | |
| EP | 1 601 032 A2 | 11/2005 | |

OTHER PUBLICATIONS

First Chinese Office Action Application No. 201711242252.5; Dated Aug. 28, 2020.

\* cited by examiner

PIXEL DEFINITION LAYER, DISPLAY SUBSTRATE, DISPLAY DEVICE AND INKJET PRINTING METHOD

The present application claims priority to the Chinese patent application No. 201711242252.5, filed on Nov. 30, 2017, the entire disclosure of which is incorporated herein by reference as part of the present application.

TECHNICAL FIELD

Embodiments of the present disclosure relate to a pixel definition layer, a display substrate, a display device and an inkjet printing method.

BACKGROUND

Organic light emitting display devices have advantages of self-luminescence, fast response, wide viewing angle, high brightness, rich colors, thinness and so on, and therefore, the technology for the organic light emitting display devices become an important display technology.

At present, the organic light emitting layer of the organic light emitting display device may be formed by an inkjet printing method, and the formation of the organic light emitting layer by the inkjet printing method requires a pixel definition layer be formed on a base substrate in advance, so as to allow ink droplets to be sprayed in a designated pixel region accurately.

SUMMARY

At least one embodiment of the present disclosure provides a pixel definition layer, which comprises: a first pixel definition layer, the first pixel definition layer comprises first openings, the first openings comprise a first sub-pixel opening and a second sub-pixel opening which are corresponding to different sub-pixels; and an opening size of the second sub-pixel opening is larger than an opening size of the first sub-pixel opening; a second pixel definition layer on the first pixel definition layer, the second pixel definition layer comprises second openings, the second openings comprise a fourth sub-pixel opening corresponding to and connecting to the first sub-pixel opening and a fifth sub-pixel opening corresponding to and connecting to the second sub-pixel opening; a difference between an opening size of the fourth sub-pixel opening and the opening size of the first sub-pixel opening is larger than a difference between an opening size of the fifth sub-pixel opening and the opening size of the second sub-pixel opening.

For example, in the pixel definition layer provided by at least one embodiment of the present disclosure, the first openings of the first pixel definition layer further comprise a third sub-pixel opening having an opening size larger than the opening size of the second sub-pixel opening; the second openings of the second pixel definition layer further comprise a sixth sub-pixel opening corresponding to and connecting to the third sub-pixel opening, and the difference between the opening size of the fifth sub-pixel opening and the opening size of the second sub-pixel opening is larger than a difference between an opening size of the sixth sub-pixel opening and an opening size of the third sub-pixel opening.

For example, in the pixel definition layer provided by at least one embodiment of the present disclosure, sizes of the second openings are same.

For example, in the pixel definition layer provided by at least one embodiment of the present disclosure, a material of the first pixel definition layer comprises a hydrophilic material, and a material of the second pixel definition layer comprises a hydrophobic material.

For example, in the pixel definition layer provided by at least one embodiment of the present disclosure, the hydrophilic material comprises silicon oxides or silicon nitrides, and the hydrophobic material comprises polyimide.

For example, in the pixel definition layer provided by at least one embodiment of the present disclosure, a thickness of the first pixel definition layer ranges from 30 nm to 300 nm, and a thickness of the second pixel definition layer ranges from 500 nm to 2000 nm.

For example, the pixel definition layer provided by at least one embodiment of the present disclosure further comprises a substrate, the first pixel definition layer and the second pixel definition layer are on the substrate; in a direction perpendicular to the substrate, a cross section of the pixel definition layer is in a stepped shape.

For example, in the pixel definition layer provided by at least one embodiment of the present disclosure, shapes of the first openings are same.

For example, in the pixel definition layer provided by at least one embodiment of the present disclosure, shapes of the second openings are same.

For example, the pixel definition layer provided by at least one embodiment of the present disclosure further comprises a substrate, the first pixel definition layer and the second pixel definition layer are on the substrate, and orthographic projections of the first openings and the second openings on the substrate are in rectangle shapes.

For example, the pixel definition layer provided by at least one embodiment of the present disclosure further comprises a substrate, the first pixel definition layer and the second pixel definition layer are on the substrate, and in a direction perpendicular to the substrate, a cross section of at least one of the first pixel definition layer and the second pixel definition layer is in a trapezoid shape.

At least one embodiment of the present disclosure provides an inkjet printing method using any one of the above-mentioned pixel definition layers, the method comprises: performing inkjet printing in openings of the first pixel definition layer and the second pixel definition layer. A height of ink that is provided in the pixel definition layer through the inkjet printing is larger than a height of the first pixel definition layer.

For example, in the inkjet printing method provided by at least one embodiment of the present disclosure, a film formed from the ink, that is provided in the openings of the first pixel definition layer and the second pixel definition layer through the inkjet printing and is dried, is in the first pixel definition layer; alternatively, the film formed from the ink, that is provided in the openings of the first pixel definition layer and the second pixel definition layer through the inkjet printing and is dried, is in the first pixel definition layer and the second pixel definition layer.

At least one embodiment of the present disclosure provides a display substrate, which comprises any one of the above-mentioned pixel definition layers.

For example, the display substrate provided by at least one embodiment of the present disclosure further comprises one or more of a light emitting layer, an electron injection layer, a hole injection layer, an electron transport layer, and an hole electron transport layer in a plurality of sub-pixel regions, in which the plurality of sub-pixel regions is obtained by connecting the plurality of first openings and the plurality of second openings in one-to-one correspondence.

For example, in the display substrate provided by at least one embodiment of the present disclosure, the display panel comprises a red sub-pixel, a green sub-pixel and a blue sub-pixel, and a size of a first opening corresponding to the red sub-pixel, a size of a first opening corresponding to the green sub-pixel and a size of a first opening corresponding to the blue sub-pixel are sequentially increased.

At least one embodiment of the present disclosure provides a display device, which comprise any one of the above-mentioned display substrates.

In the case where the inkjet printing is performed using the pixel definition layer provided by at least one embodiment of the present disclosure, because the sizes of the plurality of the second openings in the second pixel definition layer are more similar than the sizes of the plurality of the first openings, alternatively, because the sizes of the second openings are substantially the same, the surface areas of ink, exposed in the air, provided in different sub-pixels through inkjet printing, are more similar or substantially the same, and therefore the drying speeds of the ink in different sub-pixels are substantially the same, and the films formed from the ink after the ink is dried are more uniform.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

CHARACTER REFERENCE

Figure 1:
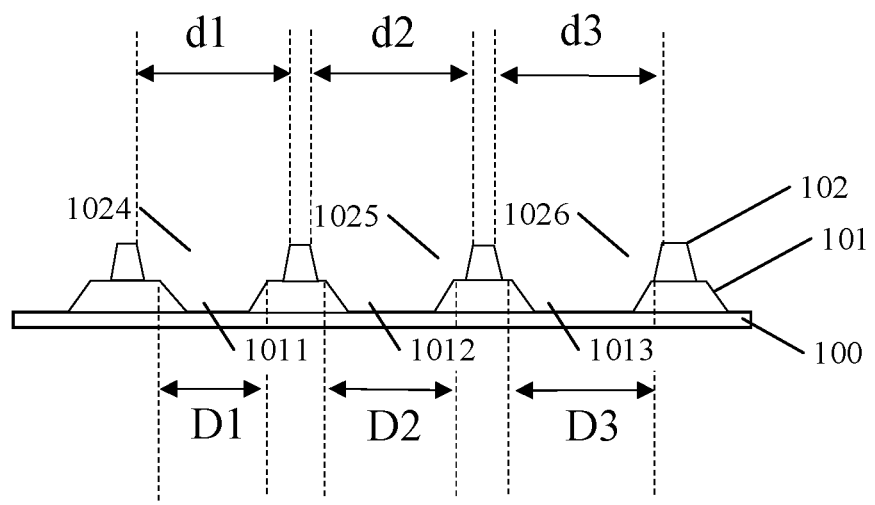
FIG. 1 is a cross-sectional schematic diagram of a pixel definition layer provided by an embodiment of the present disclosure.

100—substrate; 101—first pixel definition layer; 102—second pixel definition layer; 1011—first sub-pixel opening; 1012—second sub-pixel opening; 1013—third sub-pixel opening; 1024—fourth sub-pixel opening; 1025—fifth sub-pixel opening; 1026—sixth sub-pixel opening; 1041—red sub-pixel; 1042—green sub-pixel; 1043—blue sub-pixel.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Generally, because the pixel definition layer usually comprise a plurality of openings of different sizes, in the case where organic light emitting layers are formed by a inkjet printing method, for the reasons that volatilization speed of ink provided in the openings of different sizes through inkjet printing are different, the morphologies of the organic light emitting layers formed in the openings of different sizes are usually uneven, thereby causing the brightness of pixel regions of a display device to be inhomogeneous in the case where the display device emits light, and seriously affecting the display effect of an organic light emitting display device.

At least one embodiment of the present disclosure provides a pixel definition layer, which comprises a first pixel definition layer and a second pixel definition layer. The first pixel definition layer comprises first openings, the first openings comprise a first sub-pixel opening and a second sub-pixel opening which are corresponding to different sub-pixels; and an opening size of the second sub-pixel opening is larger than an opening size of the first sub-pixel opening. The second pixel definition layer is on the first pixel definition layer, and the second pixel definition layer comprises second openings, the second openings comprise a fourth sub-pixel opening corresponding to and connecting to the first sub-pixel opening and a fifth sub-pixel opening corresponding to and connecting to the second sub-pixel opening; a difference between the opening sizes of the fourth sub-pixel opening and the first sub-pixel opening is larger than a difference between the opening sizes of the fifth sub-pixel opening and the second sub-pixel opening.

At least one embodiment of the present disclosure provides an inkjet printing method using the above-mentioned pixel definition layer, the method comprises: performing inkjet printing in openings of the first pixel definition layer and the second pixel definition layer. A height of ink that is provided in the pixel definition layer through inkjet printing is larger than a height of the first pixel definition layer.

At least one embodiment of the present disclosure provides a display substrate, which comprises the above-mentioned pixel definition layer.

At least one embodiment of the present disclosure provides a display device, which comprise the above-mentioned display substrate.

The pixel definition layer, the display substrate, the display device, and the inkjet printing method provided by the present disclosure will be described below by a plurality of specific embodiments.

Figure 2:
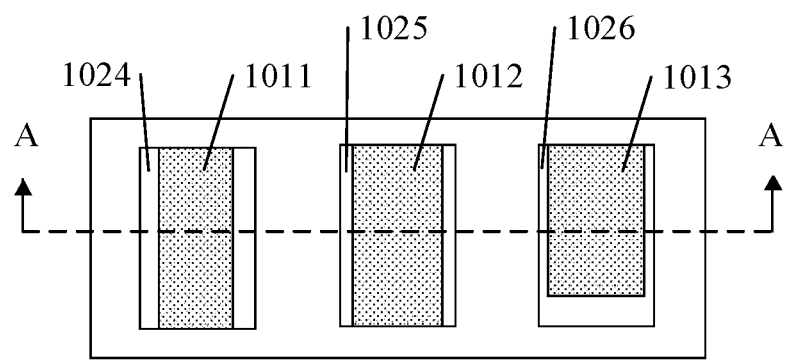
FIG. 2 is a plan view of a pixel definition layer provided by an embodiment of the present disclosure.

At least one embodiment of the present disclosure provides a pixel definition layer. FIG. 1 is a cross-sectional schematic diagram of the pixel definition layer provided by an embodiment of the present disclosure, FIG. 2 is a plan view of the pixel defining layer provided by an embodiment of the present disclosure, and FIG. 1 is a sectional view of the pixel definition layer as illustrated in FIG. 1 along line A-A. As illustrated in FIG. 1 and FIG. 2, the pixel definition layer comprises a first pixel definition layer 101 and a second pixel definition layer 102. The first pixel definition layer 101 comprises a plurality of first openings, which are corresponding to different sub-pixels, of different sizes. The second pixel definition layer 102 is on the first pixel definition layer 101, and the second pixel definition layer 102 comprises a plurality of second openings corresponding to the different sub-pixels. The plurality of first openings and the plurality of second openings are connected in one-to-one correspondence, so as to form corresponding openings as a whole.

In the embodiment, the size of an opening of a pixel definition layer refers to the size of the area occupied by an orthographic projection of the opening of the pixel definition layer on the substrate 100 on which the pixel definition layer is formed.

For example, as illustrated in FIG. 1 and FIG. 2, the first openings of the first pixel definition layer may comprise a first sub-pixel opening 1011 and a second sub-pixel opening 1012 which are corresponding to different sub-pixels, and the opening size of the second sub-pixel opening 1012 is larger than the opening size of the first sub-pixel opening 1011. The second openings of the second pixel definition layer may comprise a fourth sub-pixel opening 1024 corresponding to and connecting to the first sub-pixel opening 1011 and a fifth sub-pixel opening 1025 corresponding to and connecting to the second sub-pixel opening 1012. The size of one of the second openings of the second pixel definition layer may be, for example, larger than or equal to the size of one of the first openings of the first pixel definition layer, in which the one of the first openings is corresponding to the one of the second openings. For example, in the embodiment, the difference between the opening sizes of the fourth sub-pixel opening 1024 and the first sub-pixel opening 1011 is larger than the difference between the opening sizes of the fifth sub-pixel opening 1025 and the second sub-pixel opening 1012.

For example, as illustrated in FIG. 1 and FIG. 2, the first openings of the first pixel definition layer may further comprise a third sub-pixel opening 1013 having an opening size larger than the opening size of the second sub-pixel opening 1012; and the second openings of the second pixel definition layer further comprises a sixth sub-pixel opening 1026 corresponding to and connecting to the third sub-pixel opening 1013. The difference between the opening sizes of the fifth sub-pixel opening 1025 and the second sub-pixel opening 1012 is larger than the difference between the opening sizes of the sixth sub-pixel opening 1026 and the third sub-pixel opening 1013.

For example, in the embodiment, the sizes of the plurality of second openings may be the same, for example, the opening sizes of the fourth sub-pixel opening 1024, the fifth sub-pixel opening 1025, and the sixth sub-pixel opening 1026 are the same.

In the embodiment, in the case where the inkjet printing is performed using the pixel definition layer, ink may be provided in both the first pixel definition layer 101 and the second pixel definition layer 102 through inkjet printing. Because the sizes of the plurality of second openings in the second pixel definition layer are more similar than the sizes of the plurality of first openings, alternatively, because the sizes of the second openings are substantially the same, the surface areas of the ink, exposed in the air, provided in different sub-pixels through inkjet printing are more similar or substantially the same, and therefore the drying speeds of the ink in different sub-pixels are substantially the same, and the films obtained from the ink after the ink is dried are more uniform.

For example, in the embodiment, the thickness of the first pixel definition layer may range from 30 nm to 300 nm, for example, may be 100 nm, 150 nm, 200 nm, 250 nm, or the like. The thickness of the second pixel definition layer may range from 500 nm to 2000 nm, for example, may be 600 nm, 800 nm, 1000 nm, 1500 nm or 1800 nm, or the like.

For example, in the embodiment, as illustrated in FIG. 1, the first pixel definition layer and the second pixel definition layer are on the substrate 100, and in the direction perpendicular to the substrate 100, the cross section of the pixel definition layer is in a stepped shape.

For example, in the embodiment, the shapes of the plurality of first openings may be the same or substantially the same, for example, the shapes of the first sub-pixel opening 1011, the second sub-pixel opening 1012, and the third sub-pixel opening 1013 are substantially the same. For example, the shapes of the plurality of second openings may be the same or substantially the same, for example, the shapes of the fourth sub-pixel opening 1024, the fifth sub-pixel opening 1025, and the sixth sub-pixel opening 1026 are substantially the same. For example, the orthographic projections of one of the first openings and one of the second openings on the substrate 100 are both in polygonal shapes, such as rectangular shapes or the like, and the shapes of the openings are not limited in the embodiment. For example, in the direction perpendicular to the substrate 100, the cross section of the first pixel definition and the cross section of the second pixel definition layer are in trapezoidal shapes or the like.

It should be noted that the rectangle shape in the embodiment of the present disclosure may be a shape of a rectangle with rectangular corners or a shape of a rectangle with rounded corners, and those skilled in the art may appreciate that the rectangle shape is a rectangular shape or a substantially rectangular shape. The stepped shape, the trapezoidal shape and so on may also adopt a similar interpretation, which are not repeat here.

Next, the embodiment will be described by taking the shape of the first openings being the rectangular shapes as an example.

With reference to FIG. 1, in the embodiment, the first sub-pixel opening 1011, the second sub-pixel opening 1012, and the third sub-pixel opening 1013 are in rectangular shapes, and the widths of the first sub-pixel opening 1011, the second sub-pixel opening 1012, and the third sub-pixel opening 1013 are D1, D2, and D3, respectively, and the relationship between the values of the widths of the first sub-pixel opening 1011, the second sub-pixel opening 1012, and the third sub-pixel opening 1013 satisfies: D1<D2<D3. In addition, the lengths of the first sub-pixel opening 1011, the second sub-pixel opening 1012, and the third sub-pixel opening 1013 may be the same or different, for example, in the case as illustrated in FIG. 2, the lengths of the first sub-pixel opening 1011 and the second sub-pixel are the same, and the length of the third sub-pixel opening 1013 is slightly smaller than the lengths of the first sub-pixel opening 1011 and the second sub-pixel opening 1012.

In the embodiment, the shape of one of the second openings of the second pixel definition layer 102 may, for example, correspond to the shape of one of the first openings, for example, may be in a rectangle shape, which is also not limited in the embodiment. In the embodiment, the sizes of the plurality of second openings of the second pixel definition layer 102, for example, the fourth sub-pixel opening 1024, the fifth sub-pixel opening 1025, and the sixth sub-pixel opening 1026, are the same. For example, as illustrated in FIG. 1 and FIG. 2, the fourth sub-pixel opening 1024, the fifth sub-pixel opening 1025, and the sixth sub-pixel opening 1026 have the same lengths and the same widths, for example, in the case as illustrated in FIG. 1, the widths of the fourth sub-pixel opening 1024, the fifth sub-pixel opening 1025, and the sixth sub-pixel opening 1026 are d1, d2, and d3, respectively, and the relationship between the values of the widths of the fourth sub-pixel opening 1024, the fifth sub-pixel opening 1025, and the sixth sub-pixel opening 1026 satisfies: d1=d2=d3.

In the embodiment, in the case where the above-mentioned pixel definition layer is used in inkjet printing to form an organic functional layer, for example, organic light emitting layers of different colors may be respectively provided in the different openings through inkjet printing, for example, inkjet printing is performed in the first sub-pixel opening 1011, the second sub-pixel opening 1012, and the third sub-pixel opening 1013, respectively, so as to form a red light emitting layer, a green light emitting layer, and a blue light emitting layer.

In the embodiment, in the case where the organic light emitting layers of different colors are provided, in the first sub-pixel opening 1011, the second sub-pixel opening 1012, and the third sub-pixel opening 1013 which are of different sizes, through inkjet printing, for example, the organic light emitting layer of a certain color may be selected to be inkjet printed in the pixel opening of a certain size according to factors such as: properties (such as ink viscosity, solvent volatilization rate, and so on) of the ink of organic light emitting layers of different colors; light emitting efficiencies and lifetime of organic light emitting layers of different colors; and requirements of an light emitting device on light emitting layers of different colors in brightness, and so on. For example, in the case where the requirement of an embodiment on the blue light emitting layer in brightness is high, the blue light emitting layer may be provided in the third sub-pixel opening 1013 having a relatively large area through inkjet printing. In the embodiment, the correspondence relationship of the light emitting layers of different colors and the first openings of different sizes is not limited.

In the embodiment, the number of types of the sizes of the first openings of the first pixel definition layer 101 may adopt other numbers, for example, four, six, and so on. For example, in the case where the number of the types of the sizes of the first openings are four, the four types of first openings of different sizes may be used to form, for example, a red sub-pixel, a green sub-pixel, a blue sub-pixel, and a white sub-pixel, respectively. For example, in the case where the number of the types of the sizes of the first openings are six, the six types of first openings of different sizes may be used to form, for example, a red sub-pixel, a green sub-pixel, a blue sub-pixel, a magenta sub-pixel, a cyan sub-pixel, and a yellow sub-pixel, respectively. The number of types of the sizes of the first openings of the first pixel definition layer 101 is not limited in the embodiment.

In the embodiment, the material of the first pixel definition layer may comprise, for example, a hydrophilic material, and the hydrophilic material may be, for example, silicon-oxides or silicon-nitrides, such as silicon oxide, silicon nitride or the like. The first pixel definition layer in the bottom layer is made of the hydrophilic material to facilitate the ink, which is provided through inkjet printing, to spread in the first openings, and facilitate the ink to form a more uniform film after the ink is dried. The material of the second pixel definition layer may, for example, comprise a hydrophobic material, and the hydrophobic material may be, for example, an organic material such as polyimide, or the like. On the base substrate, the second pixel definition layer in the upper layer is made of the hydrophobic material to prevent the ink provided in the second openings through inkjet printing from flowing into adjacent sub-pixels.

In the embodiment, in the case where inkjet printing is performed using the pixel definition layer provided by the embodiment to form an organic functional layer, for example, a white light interferometer, an automatic optical detecting device, and so on may be adopted to detect the uniformity of the formed organic functional layer. The uniformity of the formed organic function is measured, for example, by detecting the percentage of the organic functional layer of which the thickness reaches the target thickness of the organic functional layer. Table 1 is a table of comparison between the uniformity data of the organic functional layers in the pixel definition layer provided by an embodiment of the present disclosure and the uniformity data of the organic functional layers in a common pixel definition layer provided as a comparative example. Compared with the pixel definition layer provided by an embodiment of the present disclosure, the common pixel definition layer provided as the comparative example does not comprise a second pixel definition layer, while other structures and experimental conditions of the above-mentioned two pixel definition layers are the same. It can be seen that all the uniformities of the organic functional layers, corresponding to the sub-pixels of various colors, in the pixel definition layer provided by the embodiment are improved to a certain degree, compared with the uniformities of the organic functional layers, corresponding to the sub-pixels of various colors, in the common pixel definition layer, and the uniformities of the organic functional layer corresponding to the sub-pixels of various colors are substantially the same. It can be seen that the uniformity of the organic functional layers formed by using the pixel definition layer provided by the embodiment through inkjet printing is increased.

TABLE 1

| sub-pixel type | uniformity (%) of an organic functional layer in common pixel definition layer | uniformity (%) of an organic functional layer in pixel definition layer provided by an embodiment of the present disclosure |
| --- | --- | --- |
| red sub-pixel | 50.8 | 70.8 |
| green sub-pixel | 56.4 | 71.4 |
| blue sub-pixel | 71.7 | 71.8 |

Figure 3A:
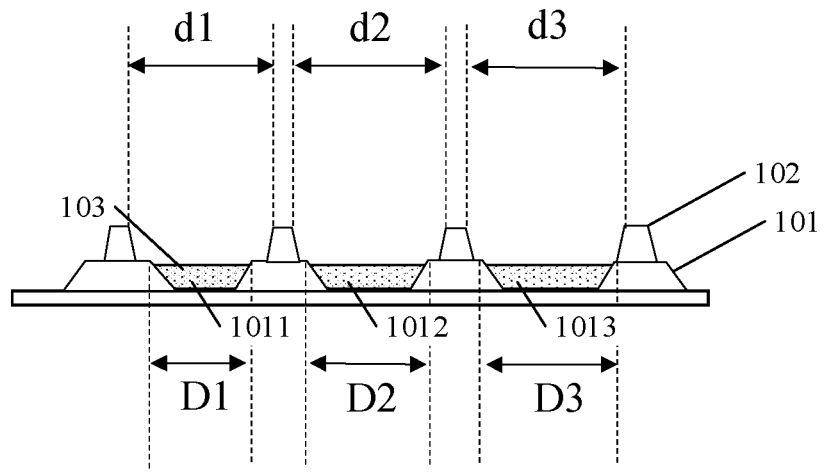
FIGS. 3A and 3B are schematic diagrams illustrating inkjet printing performed by using a pixel definition layer provided by an embodiment of the present disclosure.
Figure 3B:
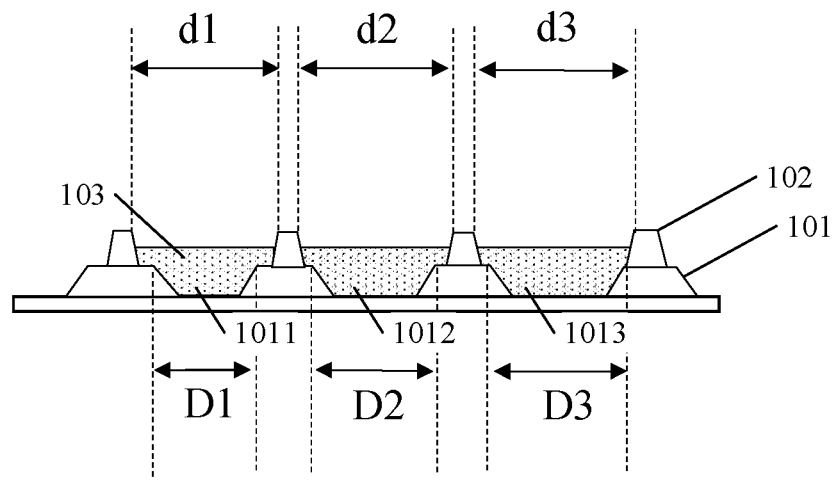

At least one embodiment of the present disclosure provides an inkjet printing method using any one of the above-mentioned pixel definition layers. The pixel definition layer is formed on a substrate, on which, for example, other structure layers or functional layers are formed. The structure layers comprise, for example, a buffer layer, a passivation layer, and so on. The functional layers comprise, for example, a driving circuit and so on, and the driving circuit comprises a gate line, a data line, a transistor, a capacitor, and so on. The pixel definition layer is formed on the structure layers or functional layers. As illustrated in FIGS. 3A and 3B, the inkjet printing method comprises: performing inkjet printing in openings provided by the first pixel definition layer 101 and the second pixel definition layer 102, for example, to form an organic functional layer 103. For example, the height of the ink that is provided in the pixel definition layer through inkjet printing is larger than the height of the first pixel definition layer.

In the embodiment, one of the organic functional layers may comprise, for example, one or more of a light emitting layer, an electron injection layer, a hole injection layer, an electron transport layer, and a hole transport layer. In the embodiment, for example, inkjet printing may be respectively performed in the first openings of different sizes and the second openings, which are connected to the first openings, of the same sizes, so as to form a red light emitting layer, a green light emitting layer, and a blue light emitting layer, and a red sub-pixel, a green sub-pixel, and a blue sub-pixel can be further formed.

In the embodiment, for example, the amount of the materials, which are provided in the openings corresponding to different sub-pixels through inkjet printing, of the organic functional layers may be selected according to factors such as the target thicknesses of the organic functional layers to be formed in the sub-pixels of different colors and the sizes of the first openings, corresponding to the organic functional layers, of the first pixel definition layer. For example, in the case where the sub-pixels, with the sizes of the first openings in the sub-pixels being sequentially increased, are respectively provided with a red light emitting layer, a green light emitting layer, and a blue light emitting layer through inkjet printing, and the target thicknesses of the red light emitting layer, the green light emitting layer, and the blue light emitting layer to be formed are sequentially decreased, for example, the amount of the materials, which are provided through inkjet printing, of the light emitting layers may be selected according to the sizes of the first openings corresponding to the sub-pixels of various colors, and the target thicknesses of the light emitting layers to be formed. Therefore, in the embodiment, the amount of the materials, which are provided in the first openings and the second openings corresponding to the sub-pixels of different colors through inkjet printing, of the organic functional layers can be adjusted according to demands, and the embodiment is not limited in this aspect.

In the embodiment, as illustrated in FIG. 3A, because the thickness of the ink is decreased after the solvent of the ink which is provided through inkjet printing is evaporated, for example, the film formed by the ink, which is provided in openings of the first pixel defining layer 101 and the second pixel defining layer 102 through inkjet printing and is dried, is in the first pixel definition layer 101. Because the first pixel definition layer 101 comprises first openings of different sizes, the surface areas of the functional layers formed in the sub-pixels of different colors are different.

In the embodiment, as illustrated in FIG. 3B, a film formed from the ink provided in openings of the first pixel defining layer 101 and the second pixel defining layer 102 through inkjet printing after the ink is dried may also be, for example, in the first pixel definition layer 101 and the second pixel definition layer 102. Because the sizes of the plurality of second openings in the second pixel definition layer are more similar than the sizes of the plurality of first openings, alternatively, because the sizes of the second openings are substantially the same, the surface areas of the functional layers formed in the second openings of the sub-pixels of different colors may be more similar or substantially the same, while the surface areas of the functional layers formed in the first openings may be different. The embodiment does not limit the formation positions of the organic functional layers formed by inkjet printing.

In the case where inkjet printing is performed by the inkjet printing method provided by the embodiment, because ink is provided in both the first pixel definition layer and the second pixel definition layer through inkjet printing, and also because the sizes of the plurality of second openings in the second pixel definition layer are more similar than the sizes of the plurality of first openings, alternatively, also because the sizes of the second openings are substantially the same, the surface areas of the ink, exposed in air, provided in different sub-pixels through inkjet printing are more similar or substantially the same, and therefore the drying speeds of the ink in the different sub-pixels are substantially the same, and the films obtained from the ink in the different sub-pixels after the ink is dried are more uniform.

Figure 4:
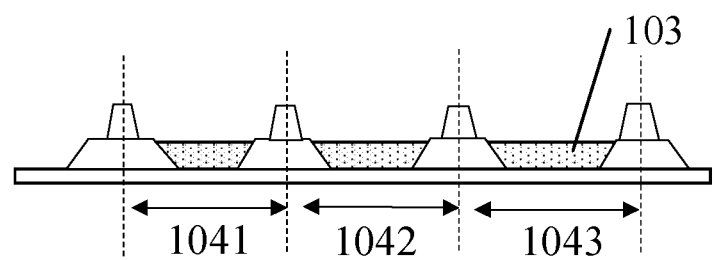
FIG. 4 is a schematic diagram of a display substrate provided by an embodiment of the present disclosure.

At least one embodiment of the present disclosure provides a display substrate. As illustrated in FIG. 4, the display substrate comprises any one of the above-mentioned pixel definition layers. The pixel defining layer is formed on a substrate, on which other structure layers or functional layers are formed. The structure layers comprise, for example, a buffer layer, a passivation layer, and so on. The functional layers comprise, for example, a driving circuit and so on, and the driving circuit comprises a gate line, a data line, a transistor, a capacitor, and so on. The pixel definition layer is formed over the structure layers or the functional layers. The display substrate further comprises organic functional layers, the organic functional layers are formed in the plurality of sub-pixel regions obtained by connecting the plurality of first openings and the plurality of second openings in one-to-one correspondence. The organic functional layer comprises one or more of a light emitting layer, an electron injection layer, a hole injection layer, an electron transport layer, and a hole transport layer, for example, for forming an organic light emitting diode device. The morphologies, thicknesses, and so on of the one or more functional layers of the display substrate are more uniform, so that the display brightness uniformity of the display substrate is increased, and therefore the display quality is increased.

In the embodiment, as illustrated in FIG. 4, the display substrate may comprise, for example, sub-pixel units of a plurality of colors, for example, the display substrate may comprise three types pf sub-pixel units including a red sub-pixel 1041, a green sub-pixel 1042, and a blue sub-pixel 1043, and the sizes of the first openings which are corresponding to the red sub-pixel pixel 1041, the green sub-pixel 1042, and the blue sub-pixel 1043, of the pixel definition layer may be, for example, sequentially increased. In the embodiment, the correspondence relationship between the red sub-pixel 1041, the green sub-pixel 1042, and the blue sub-pixel 1043 and the first openings of different sizes may be adjusted, for example, according to factors such as properties (such as ink solubility, solvent type, and so on) of the ink of light emitting layers of different colors, light emitting efficiencies and lifetime of light emitting layers of different colors, and requirements of the light emitting device on the light emitting layers of different colors in brightness, and so on, and the embodiment is not limited in this aspect.

In the embodiment, the display substrate may comprise other functional layers and structure layers, such as a pixel driving circuit for driving the organic light emitting diode device, an anode layer, a cathode layer, a planarization insulating layer, and so on, and no further description will be given in the embodiment.

Figure 5:
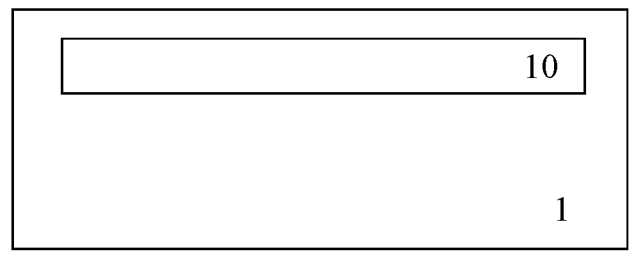
FIG. 5 is a schematic diagram of a display device provided by an embodiment of the present disclosure.

The embodiment further provides a display device. As illustrated in FIG. 5, the display device 1 comprises the above-mentioned display substrate 10. The display device 1 may be any product or component having a display function, such as a liquid crystal panel, an electronic paper, an OLED panel, a mobile phone, a tablet computer, a television, a display, a notebook computer, a digital photo frame, a navigator, and so on, and the embodiment is not limited in this aspect.

Figure 6:
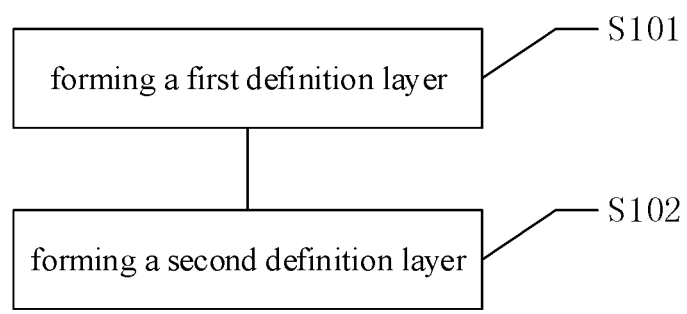
FIG. 6 is a flow chart of a manufacture method of a pixel definition layer, provided by an embodiment of the present disclosure.

At least one embodiment of the present disclosure provides a manufacture method of a pixel definition layer. As illustrated in FIG. 6, the method comprises steps S101-S102.

Before performing the above-mentioned manufacture method of a pixel defining layer, a substrate is provided first. The substrate may be a normal glass substrate, a plastic substrate, and so on, and other structure layers or functional layers may be formed on the substrate, for example, the structure layers comprise a buffer layer, a passivation layer, and so on. The functional layers comprise, for example, a driving circuit and so on, and the driving circuit comprises a gate line, a data line, a transistor, a capacitor, and so on. The pixel definition layer may be formed on the above-mentioned structure layers or functional layers.

Step S11: forming a first pixel definition layer.

Figure 7A:
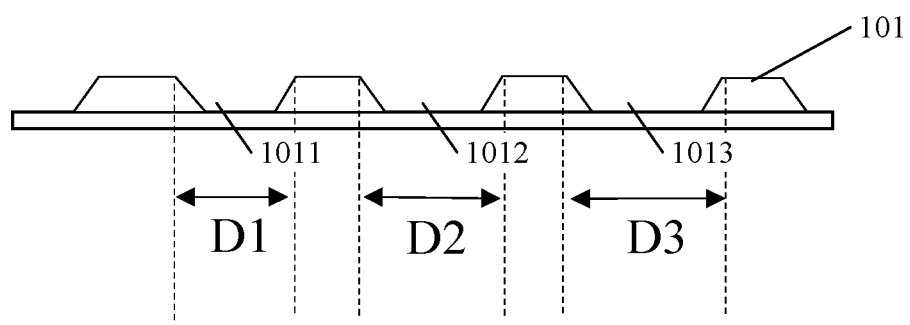
FIGS. 7A and 7B are schematic diagrams of a pixel definition layer in a manufacture process provided by an embodiment of the present disclosure.

In the embodiment, as illustrated in FIG. 7A, forming the first pixel definition layer 101 comprises: forming a plurality of first openings, which are corresponding to different sub-pixels, of different sizes in the first pixel definition layer 101'. The first pixel definition layer 101 may be formed by a photolithography method, and the photolithography method comprises, for example: depositing a first material film, coating a photoresist layer, exposing the photoresist layer, developing the photoresist layer to obtain a photoresist pattern, etching the first material film using the photoresist pattern, and so on.

In the embodiment, the shape of one of the first openings may be, for example, a rectangular shape or other suitable shapes. In the embodiment, for example, three types of first openings of different sizes may be formed in the first pixel definition layer 101, for example, a first sub-pixel opening 1011, a second sub-pixel opening 1012, and a third sub-pixel opening 1013, of which sizes are sequentially increased, are formed. For example, in FIG. 7A, the widths of the first sub-pixel opening 1011, the second sub-pixel opening 1012, and the third sub-pixel opening 1013 are D1, D2, and D3, respectively, and the relationship between the values of the widths of the first sub-pixel opening 1011, the second sub-pixel opening 1012, and the third sub-pixel opening 1013 satisfies: D1<D2<D3. The three openings may be used to form, for example, a red sub-pixel, a green sub-pixel, and a blue sub-pixel, respectively. In other examples of the embodiment, the number of the types of the sizes of the first openings may also be other numbers, such as four, six, or the like, and the embodiment is not limited in this aspect.

In the embodiment, the material of the first pixel definition layer may be, for example, a hydrophilic material, and the hydrophilic material may be, for example, silicon-oxides or silicon-nitrides, such as silicon dioxide and so on. A forming thickness of the first pixel definition layer, for example, ranges 30 nm to 300 nm, for example, the thickness is 100 nm, 150 nm, 200 nm, 250 nm, or the like. The first pixel definition layer in the bottom layer is made of the hydrophilic material to facilitate the ink that is provided in the first openings through inkjet printing to spread in the first openings and facilitate the ink to form a more uniform film after the ink is dried.

Step S102: forming a second pixel definition layer.

Figure 7B:
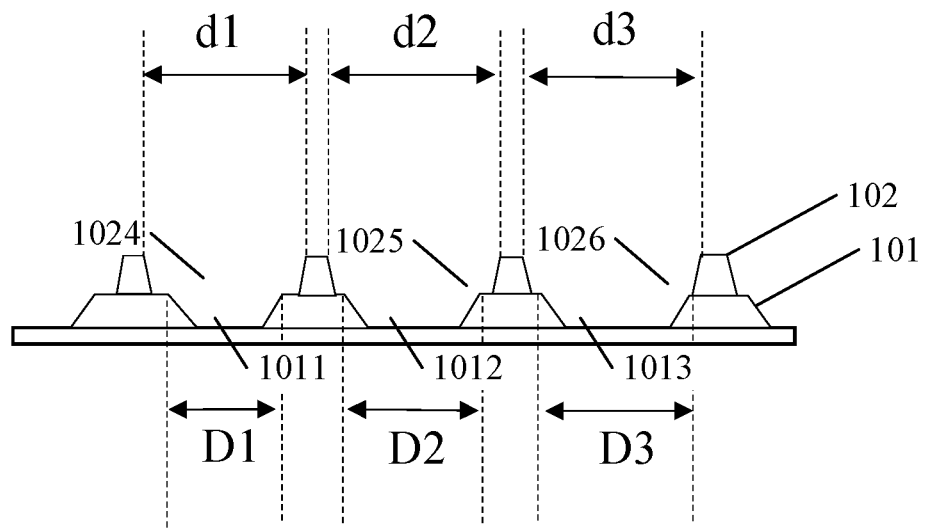

In the embodiment, as illustrated in FIG. 7B, the second pixel definition layer 102 is formed on the first pixel definition layer 101, and the shapes of the second openings formed in the second pixel definition layer 102 may, for example, correspond to the first openings, and the shapes of the second openings, for example, are rectangular shapes or other suitable shapes. The second pixel definition layer 102 may also be formed by a photolithographic method.

In the embodiment, the plurality of second openings, which are corresponding to different sub-pixels, of the same size are formed in the second pixel definition layer 102, and the plurality of first openings in the first pixel definition layer 101 and the second openings in the second pixel definition layer 102 are connected in one-to-one correspondence. As illustrated in FIG. 7B, the widths of the three second openings as illustrated in the FIG. 7B are d1, d2, and d3, respectively, and the relationship between the values of the widths of the three second openings satisfies: d1=d2=d3.

In the embodiment, the material of the second pixel definition layer may be a hydrophobic material, for example, the hydrophobic material may be polyimide and so on. The thickness of the formed second pixel definition layer, for example, ranges from 500 nm to 2000 nm, for example, the thickness is 600 nm, 800 nm, 1000 nm, 1500 nm, 1800 nm, and so on. The second pixel definition layer on the upper layer comprises the hydrophobic material to prevent the ink provided in the second openings through inkjet printing from flowing into adjacent sub-pixels.

In the case where inkjet printing is performed using the pixel definition layer manufactured by the method provided by the embodiment, because ink is provided in both the first pixel definition layer and the second pixel definition layer through inkjet printing, and also because the sizes of the plurality of second openings in the second pixel definition layer are more similar than the sizes of the plurality of first openings, alternatively, also because the sizes of the second openings are substantially the same, the surface areas of the ink, exposed in air, provided in different sub-pixels through inkjet printing are more similar or substantially the same, and therefore the drying speeds of the ink in the different sub-pixels are substantially the same, and the films obtained from the ink in the different sub-pixels after the ink is dried are more uniform.

Figure 8:
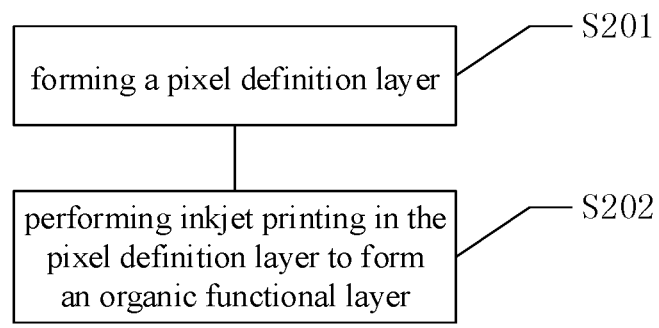
FIG. 8 is a flow chart of a manufacture method of a display substrate provided by an embodiment of the present disclosure.

At least one embodiment of the present disclosure provides a manufacture method of a display substrate. As illustrated in FIG. 8, the method comprises steps S201-S202.

Step S201: forming a pixel definition layer.

The pixel defining layer formed in the embodiment is any one of the pixel definition layers provided by the above-mentioned embodiments of the present disclosure.

Step S202: performing inkjet printing in the pixel definition layer to form an organic functional layer.

In the embodiment, the organic material is formed in the first openings of the first pixel definition layer and the second openings of the second pixel definition layer of the pixel definition layer through performing inkjet printing in the first openings of the first pixel definition layer and the second openings of the second pixel definition layer of the pixel definition layer, so as to form the organic functional layer.

In the embodiment, the organic functional layer formed by inkjet printing in the first openings of the first pixel definition layer and the second openings of the second pixel definition layer of the pixel definition layer may comprise, for example, one or more of a light emitting layer, an electron injection layer, an hole injection layer, an electron transport layer, and an hole transport layer, and the embodiment is not limited in this aspect. For example, an organic light emitting diode device comprises an anode, a light emitting layer, and a cathode that are sequentially stacked (for example, which are stacked from top to bottom or vice versa), or may comprise an anode, a hole injection layer, a light emitting layer, an electron injection layer, and a cathode that are sequentially stacked, or may comprise an anode, a hole injection layer, a hole transport layer, a light emitting layer, an electron injection layer, an electron transport layer, a cathode and so on that are sequentially stacked.

In the embodiment, for example, sub-pixels of a plurality of colors may be formed in the display substrate; for example, three sub-pixels of three different colors, such as a red sub-pixel, a green sub-pixel, and a blue sub-pixel, are formed. In the embodiment, the correspondence relationship between the sub-pixels of different colors and the first openings of different sizes may be adjusted, for example, according to factors such as properties (such as ink solubility, solvent type, and so on) of the ink of different light emitting layers of different colors, light emitting efficiencies and lifetime of organic light emitting layers of different colors, and requirements of the light emitting device on light emitting layers of different colors in brightness, and so on. For example, in the case where the brightness requirement of the red light emitting layer is relatively low in the embodiment, the red light emitting layer can be provided in the first sub-pixel opening having a small area through inkjet printing. In the embodiment, the correspondence relationship between the light emitting layers of different colors and the first openings of different sizes is not limited.

In the embodiment, for example, the amount of the materials, which are provided in different sub-pixels through inkjet printing, of the organic functional layer materials may be selected according to factors such as the target thicknesses of the organic functional layers to be formed in the sub-pixels of different colors, the sizes of the first openings, corresponding to the organic functional layers, of the first pixel definition layer, and so on. For example, in the case where the first openings, the sizes of the which are sequentially increased, in the first pixel definition layers are respectively provided with a red light emitting layer, a green light emitting layer, and a blue light emitting layer through inkjet printing, and the target thicknesses of the red light emitting layer, the green light emitting layer, and the blue light emitting layer which are to be formed are sequentially decreased, for example, the amount of the materials, which are provided through inkjet printing, of the organic functional layers may be selected according to the sizes of the first openings corresponding to the sub-pixels of the colors and the target thicknesses of the light emitting layers to be formed in the first openings. Therefore, in the embodiment, the amount of the materials, which are provided through inkjet printing, of the organic functional layers in the first openings and the second openings which are corresponding to the sub-pixels of different colors may be adjusted according to demands, and the embodiment is not limited in this aspect.

In the embodiment, the manufacture method of the display substrate may further comprise steps of forming other functional structures such as a pixel driving circuit, an anode layer, a cathode layer, a planarization insulating layer, and so on, which are not further described in the embodiment.

The morphologies, thicknesses, and so on of the organic functional layers of the display substrate are more uniform, so that the display brightness uniformity of the display substrate is increased, and therefore the display quality is increased.

The following several statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or a structure may be enlarged or reduced. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined to obtain new embodiments.

The above-mentioned descriptions are only specific embodiments of the present disclosure, but the protection scope of the present disclosure is not limited thereto, those skilled in the art may make some improvements and modifications within the technical scope of the present disclosure, and the improvements and modifications should be within the protection scope of the present disclosure. Therefore, the protection scope of the present disclosure should be determined by the protection scope of the claims.

What is claimed is:

1. A pixel definition layer, comprising:
a first pixel definition layer, wherein the first pixel definition layer comprises first openings, the first openings comprise a first sub-pixel opening and a second sub-pixel opening which are respectively corresponding to different sub-pixels; and an opening size of the second sub-pixel opening is larger than an opening size of the first sub-pixel opening;
a second pixel definition layer on the first pixel definition layer, wherein the second pixel definition layer comprises second openings, the second openings comprise a fourth sub-pixel opening corresponding to and connecting to the first sub-pixel opening and a fifth sub-pixel opening corresponding to and connecting to the second sub-pixel opening; and
wherein a difference between an opening size of the fourth sub-pixel opening and the opening size of the first sub-pixel opening is larger than a difference between an opening size of the fifth sub-pixel opening and the opening size of the second sub-pixel opening;
the first openings of the first pixel definition layer further comprise a third sub-pixel opening having an opening size larger than the opening size of the second sub-pixel opening; and the second openings of the second pixel definition layer further comprise a sixth sub-pixel opening corresponding to and connecting to the third sub-pixel opening.

2. The pixel definition layer according to claim 1, wherein the difference between the opening size of the fifth sub-pixel opening and the opening size of the second sub-pixel opening is larger than a difference between an opening size of the sixth sub-pixel opening and an opening size of the third sub-pixel opening.

3. The pixel definition layer according to claim 2, wherein a length and a width of the fourth sub-pixel opening are identical to a length and a width of the fifth sub-pixel opening, and to a length and a width of the sixth sub-pixel opening.

4. The pixel definition layer according to claim 3, wherein a width of the first sub-pixel opening, a width of the second sub-pixel opening, and a width of third sub-pixel opening are sequentially increased; and a length of the first sub-pixel opening and a length of the second sub-pixel opening are same, and a length of the third sub-pixel opening is smaller than the length of the first sub-pixel opening.

5. The pixel definition layer according to claim 1, wherein sizes of the second openings are same.

6. The pixel definition layer according to claim 1, wherein a material of the first pixel definition layer comprises a hydrophilic material, and a material of the second pixel definition layer comprises a hydrophobic material.

7. The pixel definition layer according to claim 6, wherein the hydrophilic material comprises silicon oxides or silicon nitrides, and the hydrophobic material comprises polyimide.

8. The pixel definition layer according to claim 6, wherein a thickness of the first pixel definition layer ranges from 30 nm to 300 nm, and a thickness of the second pixel definition layer ranges from 500 nm to 2000 nm.

9. The pixel definition layer according to claim 1, further comprising a substrate, wherein the first pixel definition layer and the second pixel definition layer are on the substrate; and in a direction perpendicular to the substrate, a cross section of the pixel definition layer comprises a portion that is in a stepped shape.

10. The pixel definition layer according to claim 1, wherein shapes of the first openings are same.

11. The pixel definition layer according to claim 10, further comprising a substrate, wherein the first pixel definition layer and the second pixel definition layer are on the substrate, and orthographic projections of the first openings and the second openings on the substrate are in rectangle shapes.

12. The pixel definition layer according to claim 1, wherein shapes of the second openings are same.

13. The pixel definition layer according to claim 1, further comprising a substrate, wherein the first pixel definition layer and the second pixel definition layer are on the substrate, and in a direction perpendicular to the substrate, a cross section of at least one of the first pixel definition layer and the second pixel definition layer comprises a portion that is in a trapezoid shape.

14. An inkjet printing method using the pixel definition layer according to claim 1, comprising:

performing inkjet printing in the first openings of the first pixel definition layer and the second openings of the second pixel definition layer, wherein a height of ink that is provided in the pixel definition layer through the inkjet printing is larger than a height of the first pixel definition layer.

15. The inkjet printing method according to claim 14, wherein a film formed from the ink, that is provided in the first openings of the first pixel definition layer and the second openings of the second pixel definition layer through the inkjet printing and is dried, is in the first pixel definition layer;

alternatively, the film formed from the ink, that is provided in the first openings of the first pixel definition layer and the second openings of the second pixel definition layer through the inkjet printing and is dried, is in the first pixel definition layer and the second pixel definition layer.

16. A display substrate, comprising the pixel definition layer according to claim 1.

17. The display substrate according to claim 16, further comprising one or more of a light emitting layer, an electron injection layer, a hole injection layer, an electron transport layer, and a hole electron transport layer in a plurality of sub-pixel regions, wherein the plurality of sub-pixel regions is obtained by connecting the first openings and the second openings in one-to-one correspondence.

18. The display substrate according to claim 16, wherein the display panel comprises a red sub-pixel, a green sub-pixel and a blue sub-pixel, and a size of a first opening corresponding to the red sub-pixel, a size of a first opening corresponding to the green sub-pixel and a size of a first opening corresponding to the blue sub-pixel are sequentially increased.

19. A display device, comprising the display substrate according to claim 16.

20. A pixel definition layer, comprising:

a first pixel definition layer, wherein the first pixel definition layer comprises first openings, the first openings comprise a first sub-pixel opening and a second sub-pixel opening which are respectively corresponding to different sub-pixels; and an opening size of the second sub-pixel opening is larger than an opening size of the first sub-pixel opening; and a second pixel definition layer on the first pixel definition layer, wherein the second pixel definition layer comprises second openings, the second openings comprise a third sub-pixel opening corresponding to and connecting to the first sub-pixel opening and a fourth sub-pixel opening corresponding to and connecting to the second sub-pixel opening; and wherein a difference between an opening size of the third sub-pixel opening and the opening size of the first sub-pixel opening is larger than a difference between an opening size of the fourth sub-pixel opening and the opening size of the second sub-pixel opening.

* * * * *